(12) United States Patent
Erickson

(10) Patent No.: US 8,446,997 B2
(45) Date of Patent: May 21, 2013

(54) APPARATUS AND METHOD FOR REDUCING THIRD-ORDER INTERMODULATION DISTORTION

(75) Inventor: Bruce Erickson, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 638 days.

(21) Appl. No.: 12/497,503

(22) Filed: Jul. 2, 2009

(65) Prior Publication Data

US 2011/0002428 A1    Jan. 6, 2011

(51) Int. Cl.
| H03D 1/04 | (2006.01) |
| H03D 1/06 | (2006.01) |
| H03K 5/01 | (2006.01) |
| H03K 6/04 | (2006.01) |
| H04B 1/10 | (2006.01) |
| H04L 1/00 | (2006.01) |
| H04L 25/08 | (2006.01) |

(52) U.S. Cl.
USPC ........................................... 375/346

(58) Field of Classification Search .......... 375/150, 375/285, 296, 297, 328, 346, 350; 327/100, 327/317, 358, 553
See application file for complete search history.

(56) References Cited

U.S. PATENT DOCUMENTS

| 3,680,108 | A | * | 7/1972 | Osborne | 342/370 |
| 3,825,843 | A | * | 7/1974 | Felsberg et al. | 327/317 |
| 4,091,410 | A | * | 5/1978 | Citta | 348/726 |
| 5,128,966 | A | * | 7/1992 | Bang | 375/328 |
| 6,055,278 | A | * | 4/2000 | Ho et al. | 375/296 |
| 6,122,085 | A | * | 9/2000 | Bitler | 398/193 |
| 2002/0008579 | A1 | * | 1/2002 | Mucenieks et al. | 330/149 |
| 2005/0179487 | A1 | * | 8/2005 | Lee et al. | 330/10 |
| 2005/0254595 | A1 | * | 11/2005 | Song et al. | 375/297 |
| 2006/0273853 | A1 | * | 12/2006 | Suzuki et al. | 330/151 |
| 2009/0316826 | A1 | * | 12/2009 | Koren et al. | 375/296 |

OTHER PUBLICATIONS

Kenington, Peter K., "High-Linearity RF Amplifier Design", Chapter 5, publisher Artech House, Norwood Mass., 2000.
Kenington, Peter K., "High-Linearity RF Amplifier Design", Chapter 6, publisher Artech House, Norwood Mass., 2000.
Cahana (pt 1) & Lee ( pt 2), "Linearized Transponder Technology for Satellite Communications", COMSAT Tech. Rev., vol. 15, No. 2A, Fall 1985.

* cited by examiner

Primary Examiner — David C. Payne
Assistant Examiner — Syed Haider

(57) ABSTRACT

A method and apparatus for compensating for third-order intermodulation (IM) distortion in a receiver by passing a received signal through a detector to obtain a second-order difference signal, combining the 2nd-order signal with the received signal in a multiplier to obtain a 3rd-order IM signal, adjusting a parameter such as amplitude, phase or quadrature amplitude of the 3rd-order IM signal, and coupling the 3rd-order IM signal into the received signal.

17 Claims, 4 Drawing Sheets

APPARATUS AND METHOD FOR REDUCING THIRD-ORDER INTERMODULATION DISTORTION

BACKGROUND

Electronic amplifiers and mixers are used in countless communication applications, of which transmitters, radio and television receivers, mobile telephones, and electronic test instruments such as spectrum analyzers are but a few examples. Signals propagating through such an amplifier or a mixer are subject to various kinds of distortion of which third-order intermodulation (IM) distortion can be particularly difficult to eliminate.

One way to reduce 3rd-order IM distortion is to generate a compensating signal having 3rd-order IM distortion that opposes the distortion introduced by the amplifier or mixer. Combining such a compensating signal with a signal passing through an amplifier or a mixer can reduce the distortion to an acceptably low level. Generators that provide such compensating signals have found an application in transmitters. An example is described in the paper "Linearized transponder technology for satellite communications", part 1 by D. Cahana, J. R. Potukuchi, R. G. Marshalek, and D. K. Paul, and part 2 by Y. S. Lee, I. Brelian, and A. Atia, *COMSAT Technical Review*, Volume 15 Number 2A, Fall 1985, pages 277-333. This paper describes a 3rd-order IM generator using unbiased diodes to correct for distortion in a traveling-wave-tube power amplifier.

Another technique uses a weakly distorting device such as a biased diode or transistor to generate a 3rd-order output.

This and other examples of such devices may be found in the text *High-Linearity RF Amplifier Design* by Peter B. Kenington, Chapter 6 (pages 351-424), ISBN 1-58053-143-1, published 2000 by Artech House, Inc., Norwood, Mass.

Techniques such as those described above and in Kenington have been useful primarily in systems having limited ranges of amplitude or frequency. Accordingly, there remains a need for way to compensate for 3rd-order IM distortion in applications such as superheterodyne receivers that must operate over a range of input frequencies and signal amplitudes.

SUMMARY OF THE INVENTION

Briefly and in general terms, the invention resides in a method of compensating for third-order intermodulation (IM) distortion in a receiver by passing a received signal through a detector to obtain a second-order difference signal, combining the 2nd-order signal with the received signal, for example in a multiplier, to obtain a 3rd-order IM signal, adjusting a parameter such as amplitude or phase or quadrature amplitude of the 3rd-order IM signal, and coupling the 3rd-order IM signal into the received signal.

A 3rd-order IM compensator according to principles of the invention includes a detector responsive to an input signal to provide a second-order difference signal, a multiplier responsive to the second-order difference signal and the input signal to provide a third-order intermodulation signal, a signal compensator responsive to the third-order intermodulation signal to provide a compensating signal, and a coupler that combines the compensating signal with the input signal to reduce any third-order intermodulation distortion in the input signal. Each of the detector and the multiplier may comprise one or more diodes, transistors, or other nonlinear devices.

Other aspects and embodiments of the invention will become apparent from the following description and the attached drawings, illustrating by example the principles of the invention.

BRIEF DESCRIPTION OF THE DRAWINGS

For convenience, a circuit element that is depicted in more than one figure is identified by the same reference numeral in each figure.

EMBODIMENTS OF THE INVENTION

A third-order intermodulation (IM) compensator according to an embodiment of the invention uses a two-step process to generate relatively pure 3rd-order IM signal containing a minimum of undesired input signal or 5th-order products. This is a wide-range compensator. It includes a detector to generate 2nd-order difference products from an input signal in a receiver. These 2nd-order products will have a lower frequency than the input signal, and they can easily be filtered and amplified to provide a fairly pure 2nd-order signal.

This 2nd-order signal is then applied to one of two inputs of a multiplier. The multiplier can take various forms. For example, good results have been obtained from a balanced multiplier having a pair of diodes with D.C. bias applied to operate in the square-law region, in conjunction with a microwave hybrid.

The other input of the multiplier receives the original input signal. The output from the multiplier consists of the desired 3rd-order IM signal and some residual input signal, but the residual input signal can be attenuated by using a balanced type of multiplier. A parameter of the 3rd-order IM signal such as amplitude, phase or quadrature amplitude is compensated, and the compensated 3rd-order IM signal is then introduced back into the receiver to reduce or cancel any 3rd-order IM distortion introduced into the input signal by the receiver.

The "receiver" may actually be a superheterodyne receiver, a transmitter, an amplifier, a mixer, an electronic test instrument such as a spectrum analyzer, or other non-linear communication device. Compensation of any or all of amplitude, phase or quadrature amplitude can be performed by an attenuator and phase shifter, or in some embodiments by an IQ mixer.

Such a compensator provides a practical device that corrects 3rd-order IM distortion unintentionally introduced into a signal by a non-linear communication device over wide amplitude ranges with minimal introduction of 5th-order distortion. This technique may be applied at both low IF and high microwave frequencies.

Figure 1:
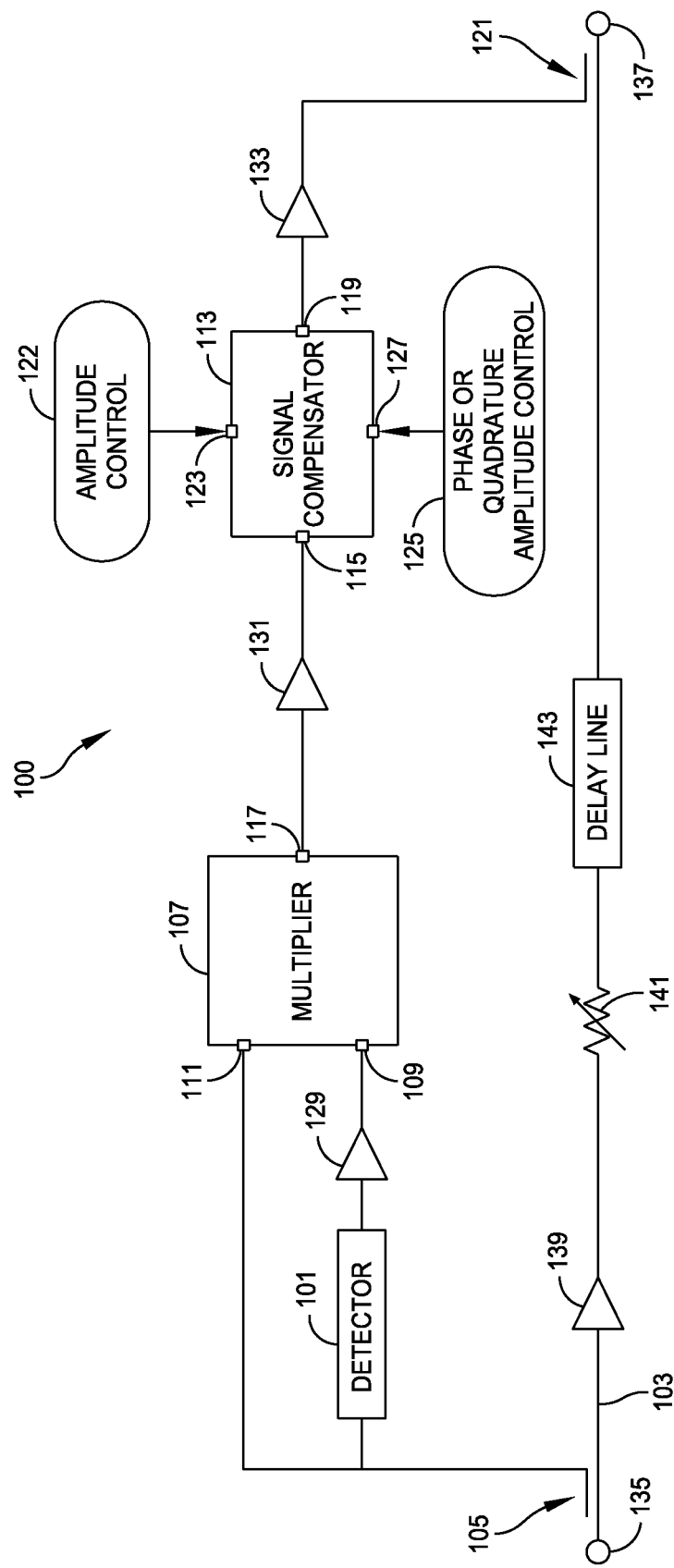
FIG. 1 is a block diagram of a third-order intermodulation compensator according to an embodiment of the invention.

Turning now to FIG. 1, an embodiment of the invention provides a third-order intermodulation compensator generally 100. A detector 101 has an input in electrical communication with a signal path 103, for example through a coupler 105, to receive an input signal from the signal path. A multiplier 107 has a first input 109 in electrical communication with an output of the detector 101 to receive from the detector a second-order difference signal. The multiplier 107 has a second input 111 in electrical communication with the signal path 103 to receive the input signal. A signal compensator 113 has an input 115 in electrical communication with an output 117 of the balanced multiplier to receive a third-order intermodulation signal and provide a compensating signal. The signal compensator 113 has an output 119 in electrical communication with the signal path, for example through a coupler 121 in which the compensating signal is combined with the input signal to reduce any third-order intermodulation distortion in the input signal.

The detector 101, for example a square-law device such as a diode, provides the second-order difference signal in response to the input signal carried by the signal path 103. The multiplier 107 provides the third-order intermodulation signal in response to the input signal and the second-order difference signal.

The signal compensator 113 is responsive to an amplitude control signal 122 received, for example, through an input 123 to vary amplitude of the 3rd-order IM signal. Similarly, the signal compensator 113 is responsive to a phase or quadrature amplitude control signal 125 received, for example, through an input 127 to vary phase or quadrature amplitude of the 3rd-order IM signal.

As will be discussed in more detail presently, the multiplier 107 may be implemented with a balanced microwave hybrid mixer or another balanced configuration, and the compensator 113 may be implemented as an I-Q mixer.

Amplification may be provided at various points as desired. For example, an amplifier 129 may be provided between the detector 101 and the multiplier 107, an amplifier 131 may be provided between the multiplier and the signal compensator 113, and an amplifier 133 may be provided between the signal compensator and the coupler 121.

The signal path 103 carries the received signal from an input point 135 to an output point 137. The signal path may include an amplifier 139, an attenuator 141, and a delay line 143 which may be implemented, for example, by a length of coaxial cable.

It will be apparent that elements represented as "an amplifier" may actually comprise one or several stages of amplification or may be replaced with attenuators as desired.

Figure 2:
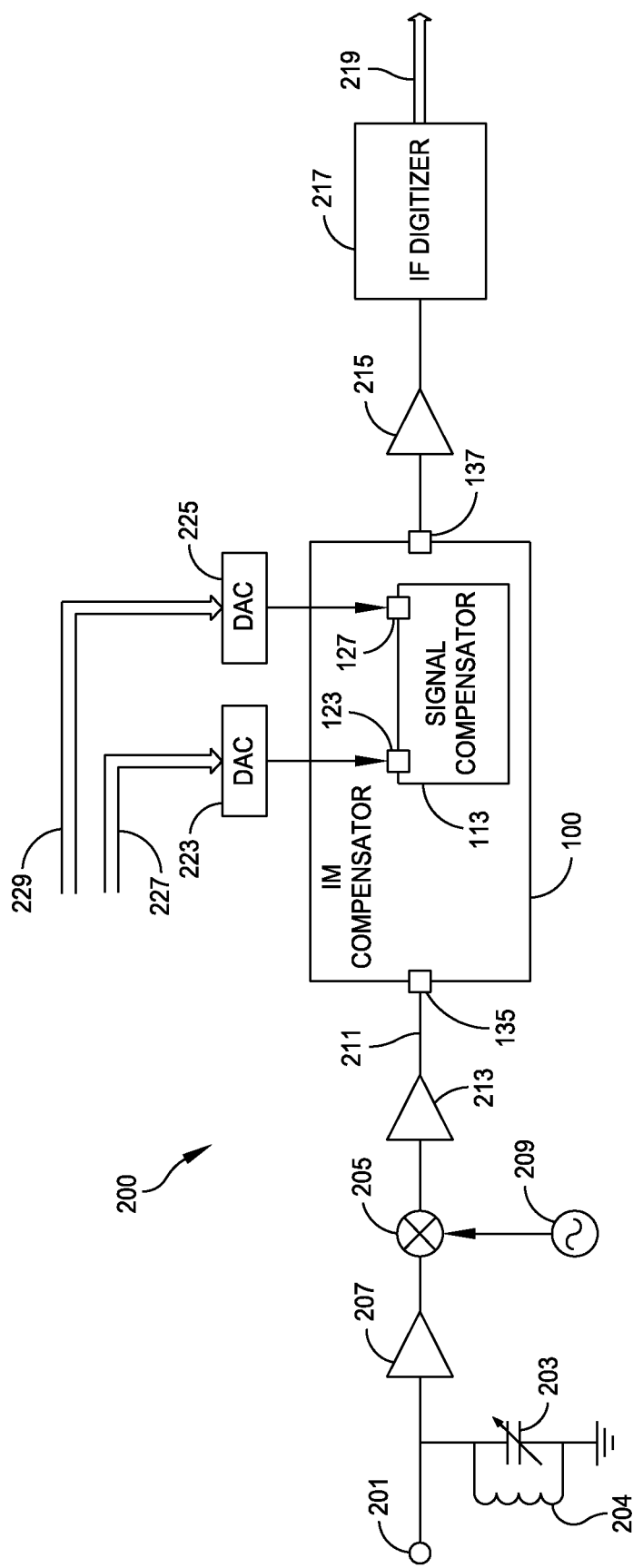
FIG. 2 is a functional diagram of a superheterodyne receiver that includes the IM compensator illustrated in FIG. 1.

Referring now to FIG. 2, an embodiment of the invention provides a superheterodyne receiver generally 200 having 3rd-order IM distortion compensation. A signal, for example an RF signal, is received at a signal input 201. Depending on the application, the input 201 may represent an antenna or a connection to some other circuit or device that provides a signal to the receiver 200. A tuning element that includes, for example, a variable capacitor 203 and an inductor 204 may be provided, either connected to the input as illustrated or in one or more other locations in the circuit. A mixer 205 receives the RF signal either directly or through an amplifier 207, for example an RF amplifier. The mixer also receives a signal from a local oscillator 209 and provides an IF signal. An IF signal path 211 carries the IF signal from the mixer, through an optional IF amplifier 213, to the input 135 of the 3rd-order IM compensator 100. The IF signal, compensated by the IM compensator 100 to minimize 3rd-order IM distortion, is provided at the output 137. Depending on the application, further amplification may be provided by an amplifier 215. In some embodiments the compensated IF signal may be detected to recover a modulating signal. In other embodiments such as the embodiment shown in FIG. 2 the compensated IF signal may be further processed, for example in an IF digitizer 217. The IF digitizer provides a digital output signal on a digital bus 219.

If the receiver is serving as a spectrum analyzer, the digital output signal is used to provide a spectral analysis of the original input RF signal. In such an instrument, the local oscillator 209 may be controlled by a sweep circuit (not shown). In a conventional receiver application, the local oscillator 209 may be controlled manually to tune the receiver to a desired frequency.

An amplitude compensation signal source, for example a digital-to-analog converter (DAC) 223, may be coupled to the IM compensator at the amplitude compensation input 123. Similarly, a DAC 225 may be connected between the D.C. voltage and the phase or quadrature amplitude IM compensator input 127. The DAC 223 may receive a digital control signal through a digital bus 227 and the DAC 225 may receive a digital control signal through a digital bus 229, or a single bus may be used for both DACs.

Figure 3:
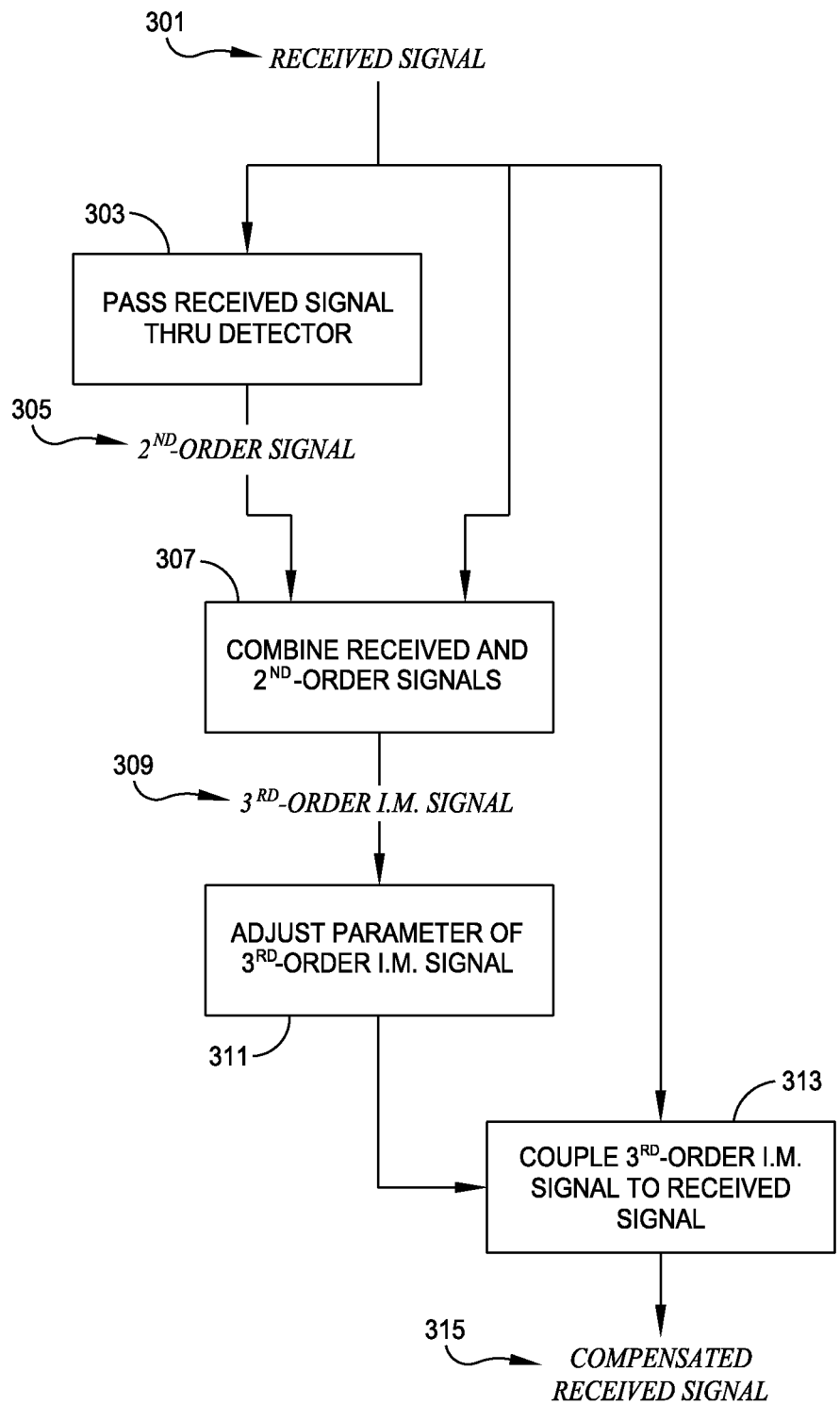
FIG. 3 is a flowchart of a method embodying the invention.

A method according to embodiments of the invention of compensating for third-order intermodulation distortion in a receiver is depicted in FIG. 3. A received signal 301 is passed 303 through a detector to obtain a 2nd-order difference signal 305. The 2nd-order signal is combined 307 with the received signal to obtain a 3rd-order IM signal 309. A parameter such as phase or amplitude or quadrature amplitude of the 3rd-order IM signal is adjusted 311, and the 3rd-order IM signal is coupled 313 into the received signal to reduce any 3rd-order IM distortion introduced into the received signal by the receiver and thereby provide a compensated received signal 315.

Figure 4:
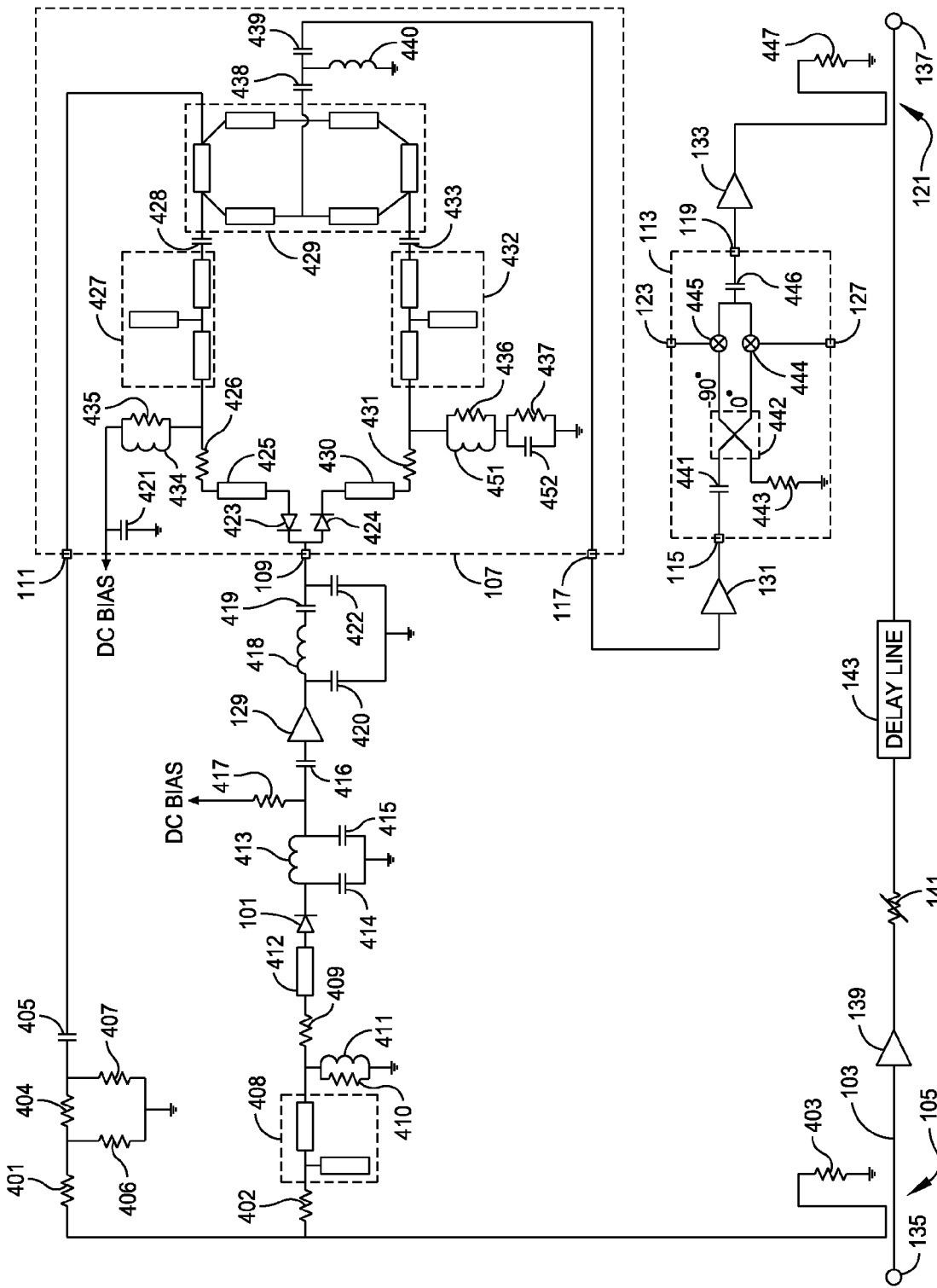
FIG. 4 is a functional diagram of a portion of a superheterodyne receiver according to an embodiment of the invention.

Functioning of a 3rd-order IM compensator embodying principles of the invention will now be explained in more detail with particular reference to FIG. 4. An input signal, for example an IF signal generated as described above, is provided at the input 135 and passes through the signal path 103. The coupler 105 couples the input signal to a resistor 401 and a resistor 402. The coupler is terminated by a resistor 403 to ground.

From the resistor 401, the input signal passes in sequence through a resistor 404 and a capacitor 405 to the input 111 of the balanced multiplier 107. A resistor 406 is connected from ground to the junction of the resistors 401 and 404. A resistor 407 is connected from ground to the junction of the resistor 404 and the capacitor 405.

From the resistor 402 the input signal passes through a matching network 408 to a resistor 409. An inductor 410 and a resistor 411 are connected in parallel from ground to the junction of the matching network 408 and the resistor 409. The input signal passes through a transmission line 412 to the detector 101, which in this embodiment is a diode—a square-law device—that rectifies the input signal to provide the 2nd-order difference signal.

The 2nd-order signal is filtered by an LC network consisting of a series inductor 413 and capacitors 414 and 415 connected from ground to either terminal of the inductor. Then the 2nd-order signal passes through a capacitor 416 to the amplifier 129, which as noted previously may have one or several stages of amplification and may include an attenuator. A D.C. bias voltage is applied to the square-law detector through a resistor 417 and the inductor 413. The amplified 2nd-order signal passes through a filter network to the input 109 of the multiplier, which in this embodiment is a balanced multiplier. This filter network includes an inductor 418 and a capacitor 419 in series, a capacitor 420 from ground to the output of the amplifier 129, and a capacitor 422 from ground to the input 109.

The 2nd-order signal enters the balanced multiplier to the cathode of a diode 423 and the anode of a diode 424. From the diode 423 the signal passes through a transmission line 425, a resistor 426, a matching network 427, and a capacitor 428 to a first input of a 180° hybrid 429. From the diode 424 the signal passes through a transmission line 430, a resistor 431, a matching network 432, and a capacitor 433 to a second input of the 180° hybrid 429.

The input signal at the input 111 of the balanced multiplier 107 is applied to a third input of the hybrid 429.

A D.C. bias is applied to the junction of the resistor 426 and the matching network 427 through a resistor 434 and an inductor 435 in parallel. A capacitor 421 is connected from that D.C. bias point to ground. The junction of the resistor 431 and the matching network 432 is biased through a series connection of a resistor 436 and a resistor 437 to ground. An inductor 451 is connected across the resistor 436 and a capacitor 452 is connected across the resistor 437.

The 3rd-order IM signal is provided at an output of the hybrid 429 and passes through a capacitor 438 and a capacitor 439 in series to the output 117 of the balanced multiplier. An inductor 440 is connected from ground to the junction of the capacitors 438 and 439.

The amplifier 131 receives the 3rd-order IM signal from the output 117 and applies it to the input 115 of the signal compensator 113. In this embodiment, the signal compensator 113 is implemented by an IQ mixer, but other circuits that can adjust amplitude and phase could be used instead. An IQ mixer such as a type HMC525 by Hittite Microwave Corporation of Chelmsford, Mass. may be used.

When used as the signal compensator 113, the Hittite IQ mixer is actually operated in reverse in that the "RF In" terminal #1 serves as the output 119, the "IF1" terminal #2 serves as the phase or quadrature amplitude control input 127, the "IF2" terminal #3 serves as the amplitude control input 123, and the "LO" terminal #4 serves as the input 115.

In the signal compensator 113, the 3rd-order IM signal is applied through a capacitor 441 to a first input of a 90° hybrid 442. A resistor 443 is connected from ground to a second input of the hybrid 442. A first output (0°) of the hybrid 442 is combined in a mixer 444 with a phase compensation signal from the signal compensator input 127. A second output (−90°) of the hybrid 442 is combined in a mixer 445 with an amplitude compensation signal from the signal compensator input 123. Outputs of the mixers 444 and 445 are combined and provided to the signal compensator output 119 through a capacitor 446 to provide the compensated 3rd-order IM signal.

The compensated 3rd-order IM signal is coupled back into the signal path through the coupler 121 which is terminated by a resistor 447 to ground.

As discussed above with reference to FIG. 2, compensating voltages are applied to the signal compensator inputs 123 and 127 to compensate amplitude, phase, or quadrature amplitude. In some embodiments these voltages are set during calibration of the receiver or other device in which the 3rd-order IM compensator is installed. In a spectrum analyzer, one or both of these voltages may vary under control of the sweep.

An IF frequency of 5.1 GHz was used in testing an embodiment of the invention. The RF input signal could be between 0 and about 3.6 GHz.

Two input signals differing from each other by about one per cent or less may be applied to the input 135. For example, signals of 5.1 and 5.101 GHz were used. These two signals are mixed in the detector 101 to produce a difference signal which is the 2nd-order signal.

The detector 101 and the diodes 423 and 424 may be implemented by HSMS-286B high frequency Schottky diodes manufactured by Avago Technologies, Inc.

The bias source for the balanced multiplier 107 and the bias source for the square-law detector are both indicated as "DC Bias". Both may be provided by the same DC voltage source, for example a bias DAC.

The 180° hybrid is based on a rat-race coupler design and DC-biased diodes. Its function is to mix the original correction signal with the base-band version of the same signal. It creates relevant mixing products at each of the original signal correction frequencies plus or minus the offset frequency of the baseband signal. Mixing products that do not involve the original two-tones are ignored and the remaining products inhabit the 3rd-order IM frequency range.

The various references to and depictions of "input" and "output" are used herein for convenience to designate points in the circuits. These may or may not represent actual physical input or output connectors.

While various embodiments and components have been described and illustrated, these embodiments and components are exemplary only and are not to be construed as limiting the invention. Various changes may be made without departing from the scope of the invention. The invention is limited only by the claims.

I claim:

1. A third-order intermodulation compensator comprising:
   a detector responsive to an input signal to provide a second-order difference signal;
   a multiplier responsive to the second-order difference signal and the input signal to provide a third-order intermodulation signal and comprising a square-law device and a balanced microwave hybrid mixer;
   a signal compensator responsive to the third-order intermodulation signal to provide a compensating signal;
   a coupler that combines the compensating signal with the input signal to reduce any third-order intermodulation distortion in the input signal; and
   a sweep circuit that controls a frequency sweep of the input signal and further controls at least one control signal supplied to the signal compensator to vary phase and quadrature amplitude of the third-order intermodulation signal according to variation of the frequency of the input signal.

2. A third-order intermodulation compensator as in claim 1 wherein the detector comprises a square-law device.

3. A third-order intermodulation compensator as in claim 1 and further comprising a digital-to-analog converter responsive to a digital input to provide the at least one control signal.

4. A third-order intermodulation compensator as in claim 1 wherein the signal compensator comprises an I-Q mixer.

5. A superheterodyne receiver comprising:
   a signal input;
   a local oscillator;
   an intermediate-frequency (IF) signal path;
   a mixer having a first input coupled to the signal input, a second input coupled to the local oscillator, and an output coupled to the IF signal path;
   a detector having an input in electrical communication with the IF signal path;
   a multiplier having a first input in electrical communication with an output of the detector and a second input in electrical communication with the IF signal path and comprising a square-law device and a balanced microwave hybrid mixer;
   a signal compensator having an input in electrical communication with an output of the multiplier;
   a coupler in electrical communication with an output of the signal compensator and the IF signal path; and a sweep circuit that controls the local oscillator to sweep an output frequency of the mixer and further controls at least one control signal supplied to the signal compensator to vary phase and quadrature amplitude of an output signal of the signal compensator according to variation of the frequency of the input signal.

6. A receiver as in claim 5 and further comprising an IF digitizer having an input in electrical communication with an output of the coupler.

7. A receiver as in claim 6 and further comprising a digital bus that receives a digital signal from the IF digitizer.

8. A receiver as in claim 6 wherein the IF digitizer comprises an analog-to-digital converter.

9. A receiver as in claim 5 wherein the IF signal path comprises a delay line.

10. A receiver as in claim 5 wherein the signal compensator comprises an I-Q mixer.

11. A receiver as in claim 5 and further comprising a digital-to-analog converter in electrical communication with the signal compensator.

12. A receiver as in claim 11 wherein the detector provides a second-order difference signal in response to an input signal on the IF signal path, the multiplier provides a third-order intermodulation signal in response to the second-order difference signal and the input signal, the digital-to-analog converter provides a control signal in response to a digital signal, the signal compensator provides a compensating signal in response to the control signal and the third-order intermodulation signal, and the coupler combines the compensating signal with the input signal to reduce any third-order intermodulation distortion in the input signal.

13. A method of compensating for third-order intermodulation distortion in a receiver comprising: (a) passing an input signal through a detector to obtain a second-order difference signal; (b) combining the second-order difference signal with the input signal to obtain a third-order intermodulation signal; (c) operating a signal compensator to adjust a phase and quadrature amplitude of the third-order intermodulation signal; (d) coupling the third-order intermodulation signal into the received signal to reduce any third-order intermodulation distortion introduced into the received signal by the receiver; and (e) operating a sweep circuit to control a frequency sweep of the input signal and to control at least one control signal supplied to the si nal compensator to vary the phase and quadrature amplitude of the third-order intermodulation signal according to variation of the frequency of the input signal.

14. A method as in claim 13 wherein step (b) is performed in a balanced multiplier.

15. A method as in claim 13, further comprising adjusting at least one of amplitude and phase of the third-order intermodulation signal.

16. A method as in claim 13 wherein step (a) comprises passing a received signal and a local oscillator signal through the detector.

17. A method as in claim 16 wherein the received signal and the local oscillator signal differ in frequency by about one per cent or less.

* * * * *

UNITED STATES PATENT AND TRADEMARK OFFICE
CERTIFICATE OF CORRECTION

| | | |
|---|---|---|
| PATENT NO. | : 8,446,997 B2 | |
| APPLICATION NO. | : 12/497503 | |
| DATED | : May 21, 2013 | |
| INVENTOR(S) | : Bruce Erickson | |

It is certified that error appears in the above-identified patent and that said Letters Patent is hereby corrected as shown below:

In the Claims:

In column 8, line 15, in claim 13, delete "si nal" and insert -- signal --, therefor.

Signed and Sealed this
Third Day of September, 2013

Teresa Stanek Rea
*Acting Director of the United States Patent and Trademark Office*